United States Patent
Yao et al.

(10) Patent No.: US 11,932,965 B2
(45) Date of Patent: Mar. 19, 2024

(54) NONLINEAR OPTICAL CRYSTAL, METHOD FOR PREPARING THE SAME AND APPLICATION THEREOF

(71) Applicant: TECHNICAL INSTITUTE OF PHYSICS AND CHEMISTRY OF THE CHINESE ACADEMY OF SCIENCES, Beijing (CN)

(72) Inventors: Jiyong Yao, Beijing (CN); Yangwu Guo, Beijing (CN); Zhuang Li, Beijing (CN); Wenhao Xing, Beijing (CN); Xiaoyu Luo, Beijing (CN)

(73) Assignee: TECHNICAL INSTITUTE OF PHYSICS AND CHEMISTRY OF THE CHINESE ACADEMY OF SCIENCES, Beijing (CN)

( * ) Notice: Subject to any disclaimer, the term of this patent is extended or adjusted under 35 U.S.C. 154(b) by 673 days.

(21) Appl. No.: 17/256,915

(22) PCT Filed: Mar. 5, 2019

(86) PCT No.: PCT/CN2019/077006
§ 371 (c)(1),
(2) Date: Dec. 29, 2020

(87) PCT Pub. No.: WO2020/015367
PCT Pub. Date: Jan. 23, 2020

(65) Prior Publication Data
US 2021/0372006 A1 Dec. 2, 2021

(30) Foreign Application Priority Data

Jul. 19, 2018 (CN) .......................... 201810796943.8
Jan. 7, 2019 (CN) .......................... 201910011540.2

(51) Int. Cl.
*C30B 29/46* (2006.01)
*C01B 19/00* (2006.01)
(Continued)

(52) U.S. Cl.
CPC ............ *C30B 29/46* (2013.01); *C01B 19/002* (2013.01); *C30B 11/02* (2013.01); *G02F 1/3551* (2013.01)

(58) Field of Classification Search
CPC ....... C30B 29/46; C01B 11/02; C01B 19/002; G02F 1/3551; C01P 2002/76; C01P 2002/77
See application file for complete search history.

(56) References Cited

FOREIGN PATENT DOCUMENTS

CN 106435737 A * 2/2017 ............... C30B 1/10
CN 106757362 A * 5/2017

OTHER PUBLICATIONS

Wang, X. Q., et al. "A systematic spectroscopic study of four bimetallic thiocyanates of chemical formula Ab (SCN) 4: ZnCd (SCN) 4 and AHg (SCN) 4 (A= Zn, Cd, Mn) as UV nonlinear optical crystal materials." Optical Materials 23.1-2 (2003): 335-341.*

(Continued)

*Primary Examiner* — Richard M Rump
(74) *Attorney, Agent, or Firm* — Paratus Law Group, PLLC

(57) ABSTRACT

Disclosed in the present invention is a nonlinear optical crystal. The chemical formula of the nonlinear optical crystal is $MHgGeSe_4$, M being selected from Ba or Sr. The nonlinear optical crystal has no symmetrical center, belongs to an orthorhombic crystal system, and has a space group Ama2. The nonlinear optical crystal is an infrared nonlinear optical crystal, and has the advantages of great nonlinear optical effect, wide light transmitting band, high hardness, (Continued)

good mechanical properties, breakage resistance, deliquescence resistance, easiness in processing and preserving, etc. Also disclosed in the present invention are a method for preparing the nonlinear optical crystal and application thereof.

16 Claims, 2 Drawing Sheets

(51) Int. Cl.
     *C30B 11/02*     (2006.01)
     *G02F 1/355*     (2006.01)

(56)         References Cited

OTHER PUBLICATIONS

Liang, Fei, et al. "Analysis and prediction of mid-IR nonlinear optical metal sulfides with diamond-like structures." Coordination Chemistry Reviews 333 (2017): 57-70.*

* cited by examiner

NONLINEAR OPTICAL CRYSTAL, METHOD FOR PREPARING THE SAME AND APPLICATION THEREOF

CROSS REFERENCE TO PRIOR APPLICATION

This application is a National Stage Patent Application of PCT International Patent Application No. PCT/CN2019/077006 (filed on Mar. 5, 2019) under 35 U.S.C. § 371, which claims priority to Chinese Patent Application Nos. 201810796943.8 (filed on Jul. 19, 2018) and 201910011540.2 (filed on Jan. 7, 2019), which are all hereby incorporated by reference in their entirety.

TECHNICAL FIELD

The present application relates to the field of nonlinear optical crystals, and in particular to a $BaHgGeSe_4$ or $SrHgGeSe_4$ nonlinear optical crystal, a method for preparing the same and application thereof.

BACKGROUND ART

Crystals with nonlinear optical effects are called as nonlinear optical crystals. Herein, the nonlinear optical effects refer to effects such as frequency doubling, sum frequency, difference frequency and parametric amplification. Only crystals having no symmetrical center can have the nonlinear optical effects. Nonlinear optical devices such as second harmonic generators, frequency up and down converters and optical parametric oscillators can be fabricated by using the nonlinear optical effects of crystals. The frequency of laser light generated by lasers can be converted by a nonlinear optical device, so that laser light with more useful wavelengths can be obtained, which makes lasers more widely used. According to applicable bands of materials, nonlinear optical materials can be divided into three categories, including ultraviolet nonlinear optical materials, visible and near-infrared nonlinear optical materials, and medium infrared nonlinear optical materials. Visible light and ultraviolet nonlinear optical crystal materials can satisfy the requirements of actual application. For example, applicable frequency doubling (532 nm) crystals mainly include KTP ($KTiOPO_4$), BBO ($\beta$-$BaB_2O_4$), LBO ($LiB_3O_5$) crystals; applicable frequency tripling (355 nm) crystals include BBO, LBO and CBO ($CsB_3O_5$) which are selectable. However, the development of infrared nonlinear crystals is relatively slow; most infrared materials are $ABC_2$ type chalcopyrite semiconductor materials. For example, the photo damage threshold of AgGaQ2 (Q=S, Se) infrared nonlinear crystals is too low and it is difficult to realize crystal growth, which directly affect the actual use. Medium infrared nonlinear optical crystals have important applications in the field of optoelectronics for example, they can extend near infrared laser light (such as 1.064 μm) to medium infrared laser light by means of optical parametric oscillation or optical parametric amplification, and can also double the frequency of important laser light (such as $CO_2$ laser light, 10.6 μm), which is of great significance for obtaining laser light with a continuously adjustable wavelength. Therefore, finding new infrared nonlinear optical crystal materials with excellent properties has become one of the difficulties and frontier directions in the field of nonlinear optical material research at present.

Therefore, in view of the problems, it is required to provide a novel infrared nonlinear optical crystal.

SUMMARY

The first purpose of the present application is to provide a nonlinear optical crystal. The nonlinear optical crystal is an infrared nonlinear optical crystal, is in a monocrystal structure, and has the advantages of great nonlinear optical effect, wide light transmitting band, high hardness, good mechanical properties, easiness in processing, etc.; and can be used to fabricate nonlinear optical devices.

The second purpose of the present application is to provide a method for preparing a nonlinear optical crystal.

The third purpose of the present application is to provide another method for preparing a nonlinear optical crystal.

The fourth purpose of the present application is to provide application of a nonlinear optical crystal.

In order to achieve the first purpose, the present application provides a nonlinear optical crystal. The chemical formula of the nonlinear optical crystal is $MHgGeSe_4$, where M is selected from Ba or Sr; the nonlinear optical crystal has no symmetrical center, belongs to an orthorhombic crystal system, and has a space group Ama2.

Preferably, when M is Ba, the cell parameters of the nonlinear optical crystal are as follows: a=11.255 Å, b=11.033 Å, c=6.685 Å, $\alpha=\beta=\gamma=90°$, Z=4.

Preferably, when M is Sr, the cell parameters of the nonlinear optical crystal are as follows: a=10.8345 Å, b=10.7441 Å, c=6.6392 Å, $\alpha=\beta=\gamma=90°$, Z=4.

In order to achieve the second purpose, the present application provides a method for preparing the nonlinear optical crystal. In this method, the nonlinear optical crystal is prepared by adopting a high-temperature melt spontaneous crystallization method, and the method specifically comprises the following steps:

heating a mixture with a component equivalent to $MHgGeSe_4$ or a powdered $MHgGeSe_4$ compound till complete melting, performing heat preservation to obtained high-temperature solution and then performing cooling to room temperature to obtain the nonlinear optical crystal, where M is selected from Ba or Sr.

Preferably, the time of p heat preservation is 24-96 h; the cooling speed is 1-10° C./h.

Preferably, the mixture with a component equivalent to $MHgGeSe_4$ is obtained by mixing raw materials containing elements M, Hg, Ge and Se, and the molar ratio of M:Hg:Ge:Se is 1:1:1:4.

Preferably, in the raw materials, M comes from elemental M or MSe; Hg comes from Hg or HgSe; Ge comes from Ge, GeSe or $GeSe_2$; Se comes from elemental Se, MSe, HgSe, GeSe or $GeSe_2$.

Preferably, a method for preparing the powdered $MHgGeSe_4$ compound comprises: uniformly mixing raw materials containing elements M, Hg, Ge and Se according to the molar ratio 1:1:1:4 of M:Hg:Ge:Se, performing heating to 600-1150° C. for solid phase reaction, and performing grinding to obtain the powdered $MHgGeSe_4$ compound.

More preferably, in the raw materials, M comes from elemental M or SrSe; Hg comes from Hg or HgSe; Ge comes from Ge, GeSe or GeSe; Se comes from elemental Se, MSe, HgSe, GeSe or $GeSe_2$.

In order to achieve the third purpose, the present application further provides a method for preparing the nonlinear optical crystal, in this method, the nonlinear optical crystal is prepared by adopting a crucible descending method, a mixture with a component equivalent to $MHgGeSe_4$ or a powdered $MHgGeSe_4$ compound is placed in a crystal growing device, heating is performed till complete melting, the crystal growing device is vertically descended, and crystallization is realized in a vertical descending process to obtain the nonlinear optical crystal, where M is selected from Ba or Sr.

Preferably, the vertical descending speed is 0.1-10 mm/h and the time is 5-20 d.

Preferably, the mixture with the component equivalent to $MHgGeSe_4$ is obtained by mixing raw materials containing elements M, Hg, Ge and Se, and the molar ratio of M:Hg:Ge:Se is 1:1:1:4.

Preferably, in the raw materials, M comes from elemental M or MSe; Hg comes from Hg or HgSe; Ge comes from Ge, GeSe or $GeSe_2$, Se comes from elemental Se, MSe, HgSe, GeSe or $GeSe_2$.

Preferably, a method for preparing the powdered $MHgGeSe_4$ compound comprises: uniformly mixing raw materials containing elements M, Hg, Ge and Se according to the molar ratio 1:1:1:4 of M:Hg:Ge:Se, performing heating to 600-1150° C. for solid phase reaction, and performing grinding to obtain the powdered $MHgGeSe_4$ compound.

More preferably, in the raw materials, M comes from elemental M or SrSe; Hg comes from Hg or HgSe; Ge comes from Ge, GeSe or $GeSe_2$; Se comes from elemental Se, MSe, HgSe, GeSe or $GeSe_2$.

Preferably, the $MHgGeSe_4$ compound (M is selected from Ba or Sr) may be prepared according to the following chemical reaction formulas:

1) $M+Hg+Ge+4Se=MHgGeSe_4$;
2) $M+Hg+GeSe+3Se=MHgGeSe_4$;
3) $M+Hg+GeSe_2+2Se=MHgGeSe_4$;
4) $M+HgSe+Ge+3Se=MHgGeSe_4$;
5) $M+HgSe+GeSe+2Se=MHgGeSe_4$,
6) $M+HgSe+GeSe_2+Se=MHgGeSe_4$;
7) $MSe+Hg+Ge+3Se=MHgGeSe_4$;
8) $MSe+Hg+GeSe+2Se=MHgGeSe_4$;
9) $MSe+Hg+GeSe_2+Se=MHgGeSe_4$;
10) $MSe+HgSe+Ge+2Se=MHgGeSe_4$;
11) $MSe+HgSe+GeSe+Se=MHgGeSe_4$;
12) $MSe+HgSe+GeSe_2=MHgGeSe_4$.

In the present application, by adopting the two methods, a $BaHgGeSe_4$ or $SrHgGeSe_4$ nonlinear optical crystal with a centimeter-scale size can be obtained; by using a large-size crucible and prolonging the growth period, a corresponding large nonlinear optical crystal can be obtained.

In order to achieve the fourth purpose, the present application provides application of the nonlinear optical crystal in preparation of a nonlinear optical device.

According to the crystallographic data of the nonlinear optical crystal, it can be used as a nonlinear optical device by orienting a crystal blank, cutting the crystal according to required angle, thickness and cross section, and polishing the light passing sides of the crystal.

Preferably, the nonlinear optical device comprises a device for passing at least one beam of incident electromagnetic radiation through at least one nonlinear optical crystal to generate at least one beam of output radiation with frequency different from the frequency of the incident electromagnetic radiation.

The nonlinear optical device may be a double-frequency generator, a frequency up and down converter, an optical parametric oscillator, an optical parametric amplifier, or the like.

The Present Application has the Following Beneficial Effects:

The nonlinear optical crystal provided by the present application is an infrared nonlinear optical crystal $SrHgGeSe_4$ or $BaHgGeSe_4$, may have a large size (centimeter scale or above) and has the advantages of great nonlinear optical effect, wide light transmitting band, good physical and chemical properties, high hardness, good mechanical properties, breakage resistance, deliquescence resistance, easiness in processing and preserving, etc.

By adopting the two methods for preparing the nonlinear optical crystals provided by the present application, large (above centimeter scale) infrared nonlinear optical crystals can be obtained. The obtained $SrHgGeSe_4$ nonlinear optical crystal has the advantages of great nonlinear optical effect, wide light transmitting band, high hardness, high double refraction, ability of realizing type-I and type-II phase matching, good mechanical properties, easiness in processing, etc.; the crystal growth speed is fast and the preparation cost is low.

Besides, the nonlinear optical crystal can be used to fabricate a nonlinear optical device.

DESCRIPTION OF THE DRAWINGS

The specific examples of the present application will be further described below in detail with reference to the drawings.

DESCRIPTION OF THE EMBODIMENTS

Figure 1:
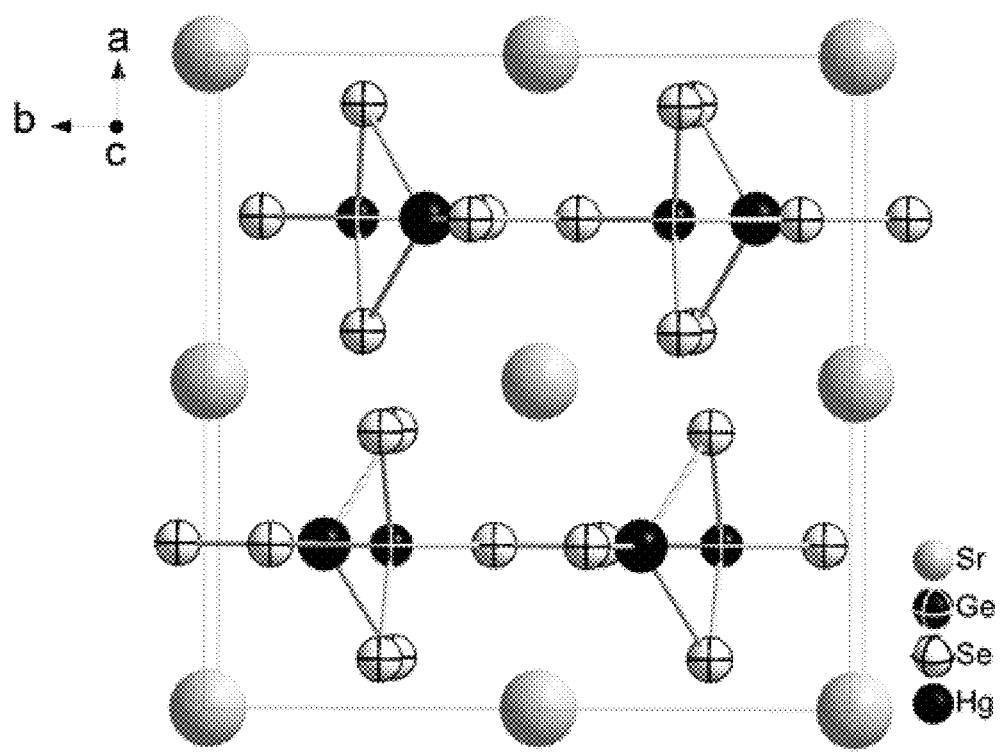
FIG. 1 illustrates a structural schematic view of a nonlinear optical crystal $SrHgGeSe_4$ prepared in example 1 of the present application.

In order to more clearly describe the present application, the present application will be further described below in combination with the preferred examples with reference to the drawings. Similar parts in the drawings are represented by the same reference signs. Those skilled in the art should understand that the content specifically described below is descriptive rather than restrictive, and should not limit the scope of protection of the present application.

EXAMPLE 1

A $SrHgGeSe_4$ nonlinear optical crystal was prepared by adopting a high-temperature melt spontaneous crystallization method. The method included the following steps:

8.33 g of SrSe, 13.98 g of HgSe and 11.53 g of $GeSe_2$ were weighed (i.e., $SrSe:HgSe:GeSe_2$=0.05 mol:0.05 mol:0.05 mol) and were uniformly mixed to obtain a mixture, then the mixture was contained in a Φ12 mm*200 mm quartz glass tube, vacuum pumping to $10^{-3}$ Pa was performed, then the quartz glass tube was sealed by adopting oxyhydrogen flame and placed in a tubular growing furnace, temperature was slowly increased to 950° C., the temperature was kept constant for 72 h, slow cooling to room temperature was performed at speed of 1° C./h, and the tubular growing furnace was closed; the quartz glass tube was cut open after cooling to obtain a Φ12 mm*60 mm yellow $SrHgGeSe_4$ crystal.

EXAMPLE 2

A SrHgGeSe$_4$ nonlinear optical crystal was prepared by adopting a crucible descending method. The method included the following steps:

33.32 g of SrSe, 55.92 g of HgSe and 39.45 g of GeSe$_2$ were weighed (Sr:Hg:Ge:Se=0.2 mol:0.2 mol:0.2 mol:0.8 mol) and were uniformly mixed to obtain a mixture, then the mixture was contained in a Φ25 mm*200 mm quartz glass tube, vacuum pumping to 10$^{-3}$ Pa was performed, then the quartz glass tube was sealed by adopting oxyhydrogen flame and placed in a crystal growing furnace, temperature was slowly increased to 950° C. to melt the raw materials, and the growing device was vertically descended at speed of 10 mm/h after the raw materials were completely melted; the crystal grew for 5 d, and after growth was completed, the growing device was cooled to room temperature in 50 h to obtain a Φ25 mm*60 mm yellow SrHgGeSe$_4$ nonlinear optical crystal.

EXAMPLE 3

A SrHgGeSe$_4$ nonlinear optical crystal was prepared by adopting a high-temperature melt spontaneous crystallization method. The method included the following steps:

A powdered SrHgGeSe$_4$ compound was weighed and contained in a Φ10 mm*100 mm quartz glass tube, vacuum pumping to 10$^{-3}$ Pa was performed, then the quartz glass tube was sealed by adopting oxyhydrogen flame and placed in a tubular growing furnace, temperature was slowly increased to 1000° C., the temperature was kept constant for 24 h, slow cooling to room temperature was performed at speed of 10° C./h, and the tubular growing furnace was closed; the quartz glass tube was cut open after cooling to obtain a Φ10 mm*60 mm yellow SrHgGeSe$_4$ nonlinear optical crystal.

EXAMPLE 4

A SrHgGeSe$_4$ nonlinear optical crystal was prepared by adopting a crucible descending method. The method included the following steps:

A powdered SrHgGeSe$_4$ compound was weighed and contained in a Φ20 mm*200 mm quartz glass tube, vacuum pumping to 10$^{-3}$ Pa was performed, then the quartz glass tube was sealed by adopting oxyhydrogen flame and placed in a crystal growing furnace, temperature was slowly increased to 1000° C. to melt the raw materials, and the growing device was vertically descended at speed of 0.1 mm/h after the raw materials were completely melted; the crystal grew for 20 d, and after growth was completed, the growing device was cooled to room temperature in 40 h to obtain a Φ20 mm*50 mm yellow SrHgGeSe$_4$ nonlinear optical crystal.

After tests, the SrHgGeSe$_4$ nonlinear optical crystals prepared in examples 1-4 belong to an orthorhombic crystal system, have a space group Ama2, have the following cell parameters: a=10.8345 Å, b=10.7441 Å, c=6.6392 Å, α=β=γ=90°, Z=4, V=772.85 Å$^3$, and have the advantages of great nonlinear optical effect (4.9 times of that of AgGaS$_2$ under the same conditions), wide light transmitting band (0.5-18 μm), high double refraction, ability of realizing type-I and type-II phase matching, good mechanical properties, breakage resistance, deliquescence resistance, and easiness in cutting, polishing and preserving. FIG. 1 illustrates a structural schematic view of the SrHgGeSe$_4$ nonlinear optical crystal.

EXAMPLE 5

A BaHgGeSe$_4$ crystal was prepared by adopting a high-temperature melt spontaneous crystallization method.

10.82 g of BaSe, 13.98 g of HgSe and 11.53 g of GeSe$_2$ were weighed (i.e., BaSe:HgSe:GeSe$_2$=0.05 mol:0.05 mol: 0.05 mol) and were uniformly mixed to obtain a mixture, then the mixture was contained in a Φ12 mm:200 mm quartz glass tube, vacuum pumping to 10$^{-3}$ Pa was performed, then the quartz glass tube was sealed by adopting oxyhydrogen flame and placed in a tubular growing furnace, temperature was slowly increased to 900° C. the temperature was kept constant for 72 h, slow cooling to room temperature was performed at speed of 1° C./h, and the tubular growing furnace was closed; the quartz glass tube was cut open after cooling to obtain a Φ12 mm*60 mm yellow BaHgGeSe$_4$ crystal.

EXAMPLE 6

A BaHgGeSe$_4$ crystal was prepared by adopting a crucible descending method.

43.26 g of BaSe, 55.92 g of HgSe and 39.45 g of GeSe$_2$ were weighed (Ba:Hg:Ge:Se=0.2 mol:0.2 mol:0.2 mol:0.8 mol) and were uniformly mixed to obtain a mixture, then the mixture was contained in a Φ25 mm*200 mm quartz glass tube, vacuum pumping to 10$^{-3}$ Pa was performed, then the quartz glass tube was sealed by adopting oxyhydrogen flame and placed in a crystal growing furnace, temperature was slowly increased to 950° C. to melt the raw materials, and the growing device was vertically descended at speed of 10 mm/h after the raw materials were completely melted; the crystal grew for 5 d, and after growth was completed, the growing device was cooled to room temperature in 50 h to obtain a Φ25 mm*60 mm yellow BaHgGeSe$_4$ nonlinear optical crystal.

EXAMPLE 7

A BaHgGeSe$_4$ crystal was prepared by adopting a high-temperature melt spontaneous crystallization method.

A powdered BaHgGeSe$_4$ compound was weighed and contained in a Φ10 mm*100 mm quartz glass tube, vacuum pumping to 10$^{-3}$ Pa was performed, then the quartz glass tube was sealed by adopting oxyhydrogen flame and placed in a tubular growing furnace, temperature was slowly increased to 1000° C., the temperature was kept constant for 24 h, slow cooling to room temperature was performed at speed of 10° C./h and the tubular growing furnace was closed; the quartz glass tube was cut open after cooling to obtain a Φ10 mm*60 mm yellow BaHgGeSe$_4$ nonlinear optical crystal.

EXAMPLE 8

A BaHgGeSe$_4$ crystal was prepared by adopting a crucible descending method.

A powdered BaHgGeSe$_4$ compound was weighed and contained in a Φ20 mm*200 mm quartz glass tube, vacuum pumping to 10$^{-3}$ Pa was performed, then the quartz glass tube was sealed by adopting oxyhydrogen flame and placed in a crystal growing furnace, temperature was slowly increased to 1000° C. to melt the raw materials, and the growing device was vertically descended at speed of 0.1 mm/h after the raw materials were completely melted; the crystal grew for 20 d, and after growth was completed, the growing device was cooled to room temperature in 40 h to obtain a Φ20 mm*50 mm yellow BaHgGeSe$_4$ nonlinear optical crystal.

Figure 2:
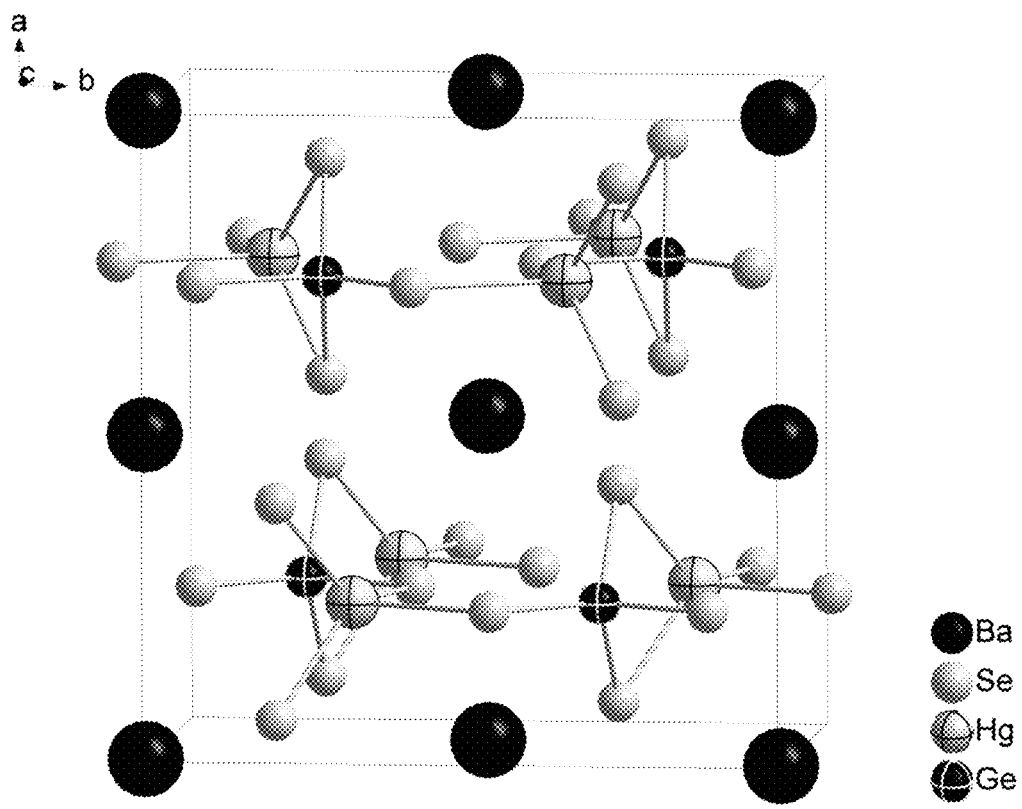
FIG. 2 illustrates a structural schematic view of a nonlinear optical crystal $BaHgGeSe_4$ prepared in example 5 of the present application.

After tests, the BaHgGeSe$_4$ nonlinear optical crystals prepared in examples 5-8 belong to an orthorhombic crystal system, have a space group Ama2, have the following cell parameters: a=11.255 Å, b=11.033 Å, c=6.685 Å, α=β=γ=90°, Z=4, V=830.12 Å$^3$, have a frequency doubling effect, and have a light transmitting range of 0.55-18 μm. FIG. 2 illustrates a structural schematic view of the BaHgGeSe$_4$ nonlinear optical crystal.

EXAMPLE 9

Figure 3:
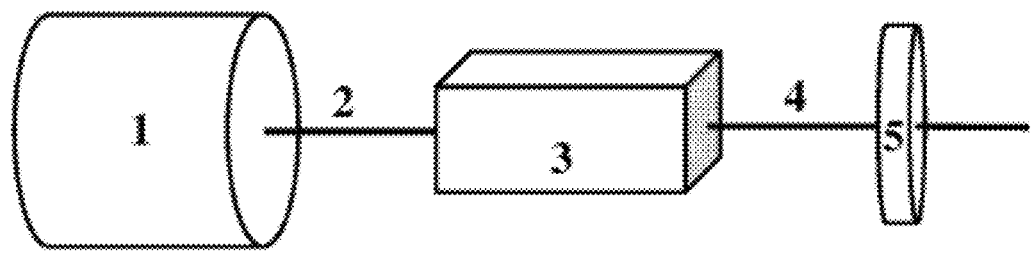
FIG. 3 illustrates a working principle diagram of a nonlinear optical device obtained by adopting a nonlinear optical crystal according to one example of the present application. In the drawings: 1-laser, 2-incident laser beam, 3-nonlinear optical crystal after crystal post-treatment and optical processing, 4-generated emergent laser beam, 5-filter.

The crystal prepared in each example was used to fabricate a nonlinear optical device. The working principle of the device was as illustrated in FIG. 3, in which 1 represents a laser, 2 represents an incident laser beam, 3 represents a nonlinear optical crystal SrHgGeSe$_4$ or BaHgGeSe$_4$ after crystal post-treatment and optical processing, 4 represents a generated emergent laser beam, and 5 represents a filter. The working principle was as follows: the incident laser beam 2 emitted from the laser 1 was enabled to enter the SrHgGeSe$_4$ monocrystal or the BaHgGeSe$_4$ monocrystal 3 prepared in each example, and the generated emergent laser beam 4 passed through the filter 5 to obtain a required laser beam.

The SrHgGeSe$_4$ crystal prepared in example 1 was used to fabricate the nonlinear optical device. At room temperature, a Q-switched Ho:Tm:Cr:YAG laser was used as a light source, incident light was infrared light with a wavelength of 2090 nm, frequency-doubled light with a wavelength of 1045 nm was output, the laser intensity was 4.9 times of that of AgGaS$_2$ under the same conditions. When the crystals prepared in examples 2-4 were used to fabricate the nonlinear optical devices, the same results were obtained.

The BaHgGeSe$_4$ crystal prepared in example 5 was used to fabricate the nonlinear optical device. At room temperature, a Q-switched Ho:Tm:Cr:YAG laser was used as a light source, incident light was infrared light with a wavelength of 2090 nm, frequency-doubled light with a wavelength of 1045 nm was output, the laser intensity was 2.2 times of that of AgGaS$_2$ under the same conditions. When the crystals prepared in examples 6-8 were used to fabricate the nonlinear optical devices, the same results were obtained.

The nonlinear optical device may be a double-frequency generator, a frequency up and down converter, an optical parametric oscillator, an optical parametric amplifier, or the like.

Apparently, the above examples of the present application are just examples used for clearly describing the present application instead of limitations to the implementation modes of the present application. Those skilled in the art may also make other different changes or variations based on the description. It is impossible to exhaust all implementation modes here. All obvious changes or variations derived from the technical solution of the present application shall also be included in the scope of protection of the present application.

The invention claimed is:

1. A nonlinear optical crystal, wherein the chemical formula of the nonlinear optical crystal is MHgGeSe$_4$, where M is selected from Ba or Sr; the nonlinear optical crystal has no symmetrical center, belongs to an orthorhombic crystal system, and has a space group Ama2.

2. The nonlinear optical crystal according to claim 1, wherein when M is Ba, the cell parameters of the nonlinear optical crystal are as follows: a=11.255 Å, b=11.033 Å, c=6.685 Å, α=β=γ=90°, Z=4;

when M is Sr, the cell parameters of the nonlinear optical crystal are as follows: a=10.8345 Å, b=10.7441 Å, c=6.6392 Å, α=β=γ=90°, Z=4.

3. A method for preparing the nonlinear optical crystal according to claim 1, wherein the nonlinear optical crystal is prepared by adopting a high-temperature melt spontaneous crystallization method, and the method specifically comprises the following steps:

heating a mixture with a component equivalent to MHgGeSe$_4$ or a powdered MHgGeSe$_4$ compound till complete melting, performing heat preservation to obtain high-temperature solution and then performing cooling to room temperature to obtain the nonlinear optical crystal, where M is selected from Ba or Sr.

4. The method for preparing the nonlinear optical crystal according to claim 3, wherein the time of heat preservation is 24-96 h; the cooling speed is 1-10° C./h.

5. The method for preparing the nonlinear optical crystal according to claim 1, wherein the nonlinear optical crystal is prepared by adopting a crucible descending method, a mixture with a component equivalent to MHgGeSe$_4$ or a powdered MHgGeSe$_4$ compound is placed in a crystal growing device, heating is performed till complete melting, the crystal growing device is vertically descended, and crystallization is realized in a vertical descending process to obtain the nonlinear optical crystal, where M is selected from Ba or Sr.

6. The method for preparing the nonlinear optical crystal according to claim 5, wherein the vertical descending speed is 0.1-10 mm/h and the time is 5-20 d.

7. The method for preparing the nonlinear optical crystal according to claim 3, wherein the mixture with a component equivalent to MHgGeSe$_4$ is obtained by mixing raw materials containing elements M, Hg, Ge and Se, and the molar ratio of M:Hg:Ge:Se is 1:1:1:4.

8. The method for preparing the nonlinear optical crystal according to claim 3, wherein in the raw materials, M comes from elemental M or MSe; Hg comes from Hg or HgSe; Ge comes from Ge, GeSe or GeSe$_2$; Se comes from elemental Se, MSe, HgSe, GeSe or GeSe$_2$.

9. The method for preparing the nonlinear optical crystal according to claim 3, wherein a method for preparing the powdered MHgGeSe$_4$ compound comprises: uniformly mixing raw materials containing elements M, Hg, Ge and Se according to the molar ratio 1:1:1:4 of M:Hg:Ge:Se, performing heating to 600-1150° C. for solid phase reaction, and performing grinding to obtain the powdered MHgGeSe$_4$ compound.

10. A nonlinear optical device comprising the nonlinear optical crystal according to claim 1.

11. The nonlinear optical device according to claim 10, wherein the nonlinear optical device comprises a device for passing at least one beam of incident electromagnetic radiation through at least one nonlinear optical crystal to generate at least one beam of output radiation with frequency different from the frequency of the incident electromagnetic radiation.

12. The method for preparing the nonlinear optical crystal according to claim 5, wherein the mixture with a component equivalent to MHgGeSe$_4$ is obtained by mixing raw materials containing elements M, Hg, Ge and Se, and the molar ratio of M:Hg:Ge:Se is 1:1:1:4.

13. The method for preparing the nonlinear optical crystal according to claim 5, wherein in the raw materials, M comes from elemental M or MSe; Hg comes from Hg or HgSe; Ge comes from Ge, GeSe or GeSe$_2$; Se comes from elemental Se, MSe, HgSe, GeSe or GeSe$_2$.

14. The method for preparing the nonlinear optical crystal according to claim 5, wherein a method for preparing the powdered MHgGeSe$_4$ compound comprises: uniformly mixing raw materials containing elements M, Hg, Ge and Se according to the molar ratio 1:1:1:4 of M:Hg:Ge:Se, performing heating to 600-1150° C. for solid phase reaction, and performing grinding to obtain the powdered MHgGeSe$_4$ compound.

15. The method for preparing the nonlinear optical crystal according to claim 9, wherein, in the raw materials, M comes from elemental M or SrSe; Hg comes from Hg or HgSe; Ge comes from Ge, GeSe or GeSe$_2$; Se comes from elemental Se, MSe, HgSe, GeSe or GeSe$_2$.

16. The method for preparing the nonlinear optical crystal according to claim 14, wherein, in the raw materials, M comes from elemental M or SrSe; Hg comes from Hg or HgSe; Ge comes from Ge, GeSe or GeSe$_2$; Se comes from elemental Se, MSe, HgSe, GeSe or GeSe$_2$.

\* \* \* \* \*